Figure 1:
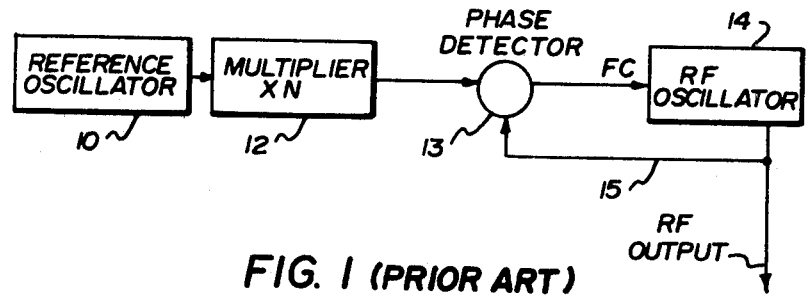

United States Patent [19]

Cornish et al.

[11] 4,327,336
[45] Apr. 27, 1982

[54] MICROWAVE PHASE LOCKED LOOPS USING FET FREQUENCY DIVIDERS

[75] Inventors: William D. Cornish; Trevor W. Tucker, both of Nepean, Canada

[73] Assignee: Her Majesty the Queen in right of Canada, as represented by the Minister of National Defence, Ottawa, Canada

[21] Appl. No.: 156,583

[22] Filed: Jun. 5, 1980

[30] Foreign Application Priority Data

Mar. 13, 1980 [CA] Canada .................................... 347619

[51] Int. Cl.$^3$ ............................................. H03L 7/08
[52] U.S. Cl. ................................. 331/8; 307/225 C; 331/25; 333/218
[58] Field of Search ...................... 331/1 A, 8, 18, 25; 307/225 C; 333/218; 328/16, 19

[56] References Cited

U.S. PATENT DOCUMENTS

| | | | |
|---|---|---|---|
| 3,393,380 | 7/1968 | Webb et al. | 331/25 X |
| 3,535,651 | 10/1970 | Peterson | 331/17 X |
| 4,152,680 | 5/1979 | Harrison | 333/218 |
| 4,266,208 | 5/1981 | Cornish | 333/218 |
| 4,297,648 | 10/1981 | Tucker et al. | 331/25 |

Primary Examiner—Siegfried H. Grimm
Attorney, Agent, or Firm—Larson and Taylor

[57] ABSTRACT

Disclosed is a microwave frequency generator for producing a microwave signal with high frequency accuracy, high spectral purity, low noise and high frequency stability. It is known to phase lock the fundamental microwave oscillator to a highly stable crystal oscillator at lower frequency and convert to a higher output frequency with a multiplier or harmonic generator but fm noise is also multiplied. The present invention avoids this problem by using MESFET frequency dividers to phase lock a microwave oscillator to a stable reference oscillator without the need for frequency multipliers. The MESFET frequency divider provides signal gain instead of loss during operation.

10 Claims, 11 Drawing Figures

MICROWAVE PHASE LOCKED LOOPS USING FET FREQUENCY DIVIDERS

This invention relates to a microwave frequency generator, and in particular a microwave frequency generator capable of producing a signal with high frequency accuracy, high spectral purity, low noise and high frequency stability.

It is known to produce a microwave frequency by phase locking the fundamental microwave oscillator to a highly stable crystal oscillator at a lower frequency; for example, the output of the crystal oscillator may be multiplied and applied to one input of a phase detector, the other input of which is fed by the microwave rf oscillator. The phase detector compares the two inputs and produces an output voltage which controls the frequency of the rf oscillator. A harmonic generator may be used instead of a multiplier. Still another possibility is to divide the output of the rf oscillator before comparison in the phase detector with a reference oscillator having an output of lower frequency than the rf oscillator. The output of the rf oscillator is then multiplied to produce the output signal.

A problem with multiplication is that any fm noise associated with the reference oscillator is increased by a factor equal to the multiplying factor.

The present invention avoids this problem by using microwave FET frequency dividers, particularly MESFET frequency dividers, to phase lock a microwave oscillator to a stable reference oscillator without the need for frequency multipliers. The FET devices provide signal gain instead of loss during operation.

Thus, in accordance with a broad aspect of the invention, there is provided a microwave frequency generator comprising a microwave frequency rf oscillator having a control input and having an output forming the output of the microwave frequency generator, a microwave frequency divider having an input connected to receive the output of the rf oscillator and frequency divide it by a factor N and having an output connected to one input of a phase detector, said phase detector having another input connected to receive the output of a reference oscillator and having an output connected to said control input, whereby the rf oscillator produces an rf frequency of N times the frequency of the reference oscillator, said microwave frequency divider comprising at least one MESFET (metal semiconductor field effect transistor) having a gate, a source and a drain, a first transmission line connected to said gate and source and to input terminal means, said transmission line forming, with inherent frequency dependent non-linear capacitance between said gate and source, a resonant circuit at $f_o/N$, where $f_o$ is the frequency to be applied to said input terminal means, a second transmission line being connected to said source and drain and to output terminal means, whereby said MESFET simultaneously provides parametric frequency division and amplification at microwave frequencies.

According to another broad aspect of the invention, there is provided a microwave frequency generator comprising a microwave frequency rf oscillator having a control input and having an output forming the output of the microwave frequency generator, a microwave frequency divider having an input connected to receive the output of the rf oscillator and frequency divide it by a factor N and having an output connected to one input of a phase detector, said phase detector having another input connected to receive the output of a reference oscillator and having an output connected to said control input, whereby the rf oscillator produces an rf frequency of N times the frequency of the reference oscillator, said microwave frequency divider comprising a first and a second MESFET (metal semiconductor field effect transistor), each having a source electrode, a drain electrode and a gate electrode, the gate of said first MESFET being connected via a first transmission line to an input terminal and the gate of said second MESFET being connected via a second transmission line to said input terminal, said source electrodes being connected to ground, said drain electrodes being connected via third and fourth transmission lines to a balun transformer having output connection means, said first and second transmission lines being of equal length and forming, with inherent gate-to-source frequency dependent non-linear capacitances of the MESFET's, a circuit resonant at $f_o/N$, where $f_o$ is the frequency of the rf oscillator, said MESFET's simultaneously providing parametric frequency division and amplification at microwave frequencies.

Figure 2:
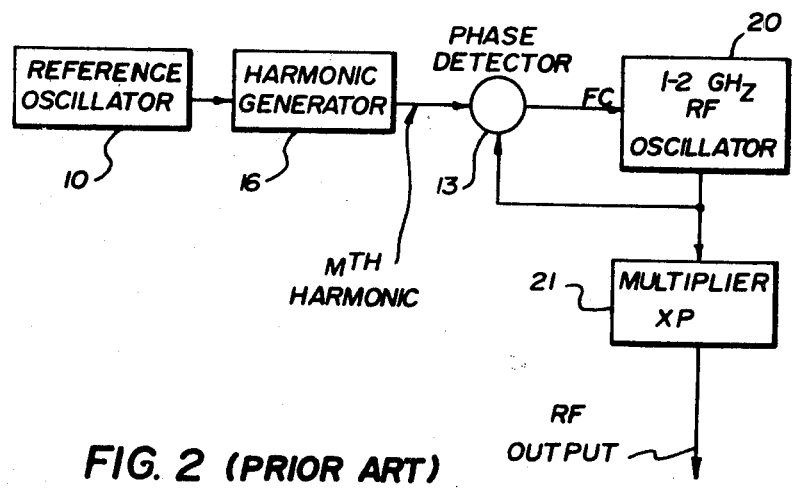
Figure 3:
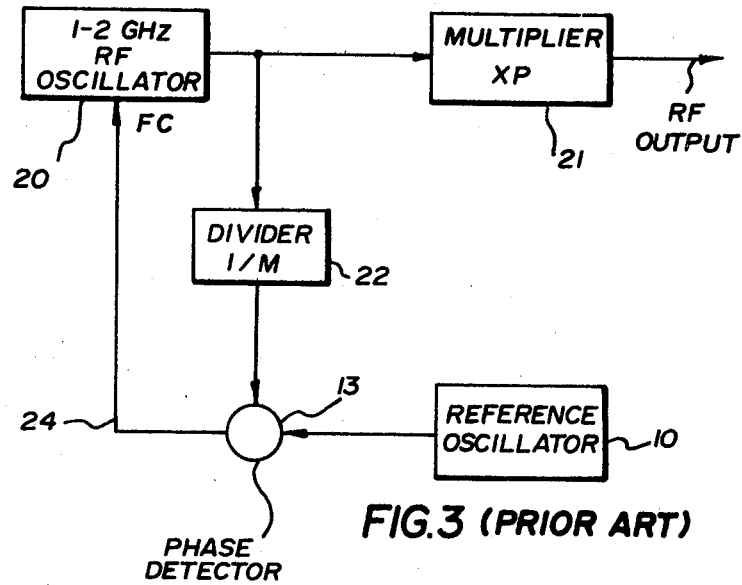
Figure 4:
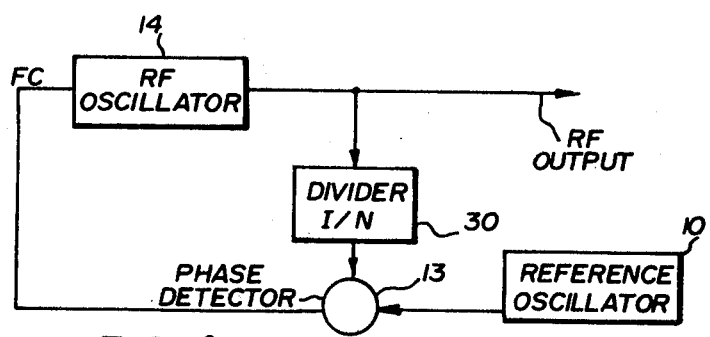
Figure 5:
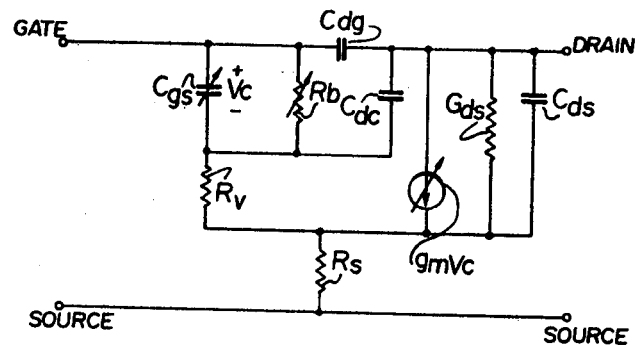
Figure 6:
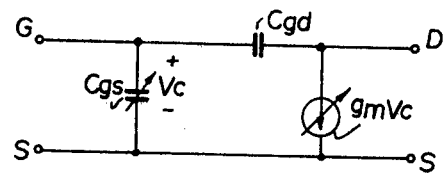
Figure 7:
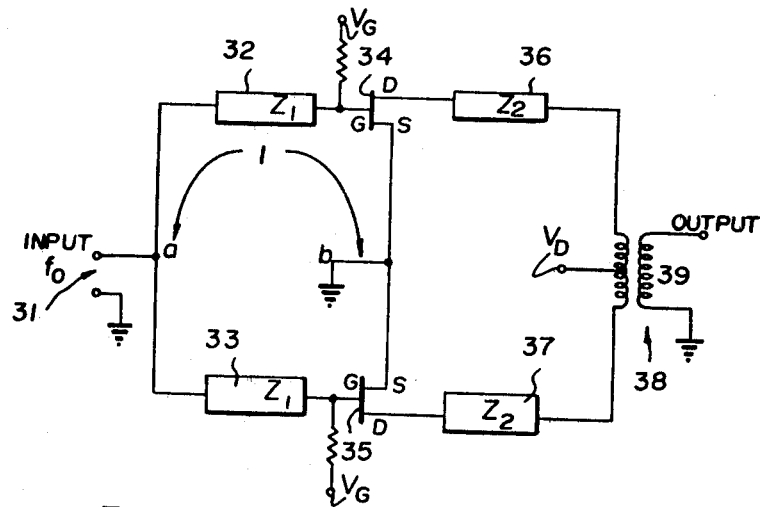
Figure 8:
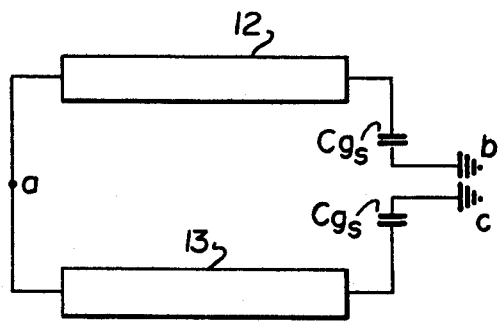
Figure 9:
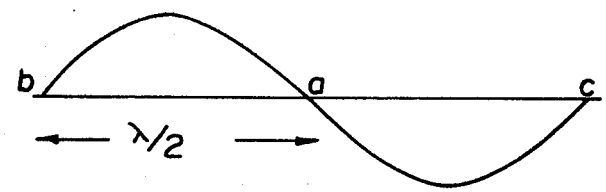
Figure 11:
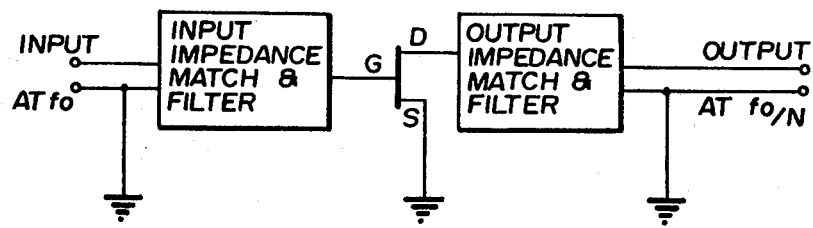
Figure 10:
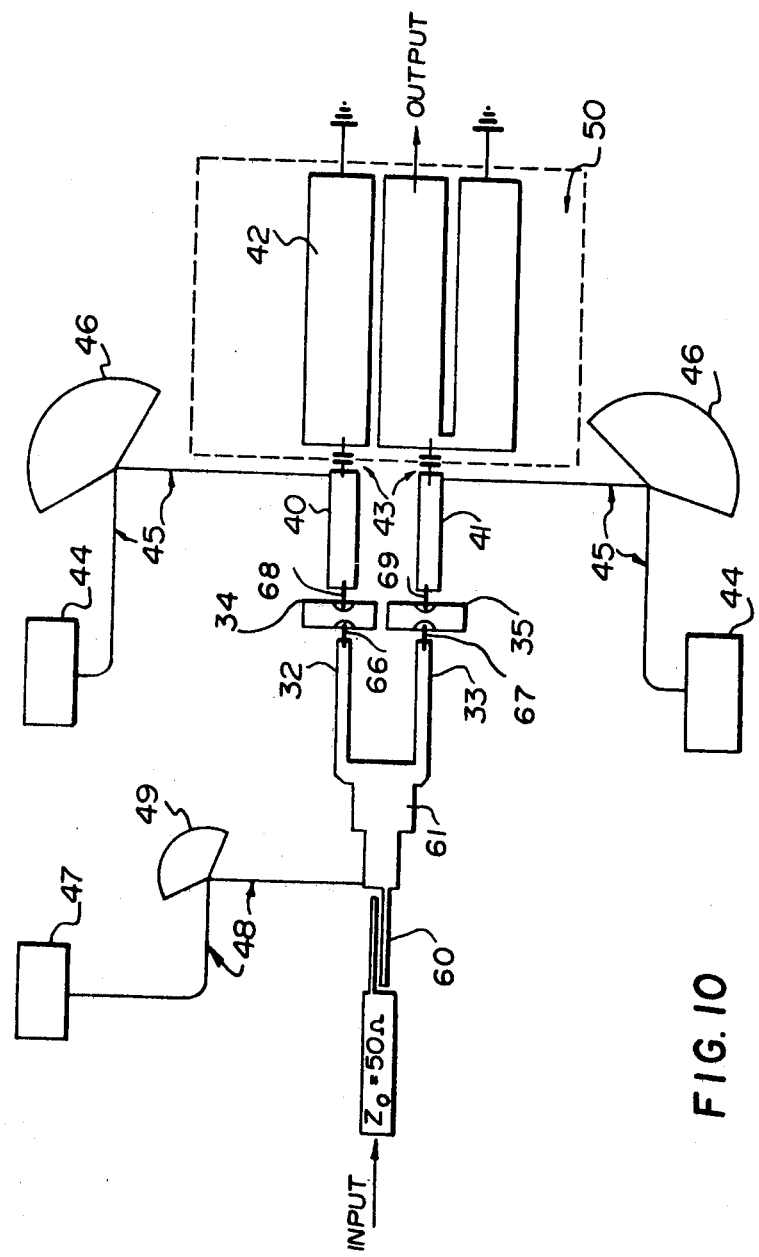

The invention will now be further described in conjunction with the accompanying drawings, in which:

FIG. 1 is a block diagram of one known type of microwave frequency generator,

FIG. 2 is a block diagram of another known type of microwave frequency generator, FIG. 3 is a block diagram of a third type of known microwave frequency generator, FIG. 4 is a block diagram of a microwave frequency generator according to the present invention, FIG. 5 is an equivalent circuit diagram of a MESFET, FIG. 6 is a simplified intrinsic circuit of a MESFET, FIG. 7 is a simplified diagram of a MESFET frequency divider using a balanced circuit, FIG. 8 is a diagram illustrating the input resonant circuit, FIG. 9 illustrates the relative wave structure at the output frequency $f_o/N$, FIG. 10 is a diagram of a microstrip implementation of a MESFET frequency divider according to the invention, and FIG. 11 is a simplified diagram of a frequency divider using a single MESFET.

Referring to FIG. 1, the output frequency of the reference oscillator 10 is multiplied (XN) in multiplier 12 up to the desired rf frequency. A phase detector 13 compares the multiplied reference frequency with the output frequency of oscillator 14 as fed back over line 15 to another input of the phase detector. The phase detector produces an output signal that depends on the difference between its two inputs and this signal is used to adjust the rf oscillator frequency to N times that of the reference. In this way an rf signal is produced that approaches the stability of the Nth harmonic of the reference oscillator 10.

Referring to FIG. 2, the same result is here achieved in a slightly different manner. The output of the reference oscillator 10 drives a harmonic generator 16. The Nth harmonic is compared to the output of an rf oscillator 20 in the one to two GHz region in the same manner as described for FIG. 1, this comparison being done in the phase detector 13. The stabilized output of the 1-2 GHz oscillator 20 is then multiplied (XP) in multiplier 21 up to the required rf frequency.

FIG. 3 uses a third variation to stabilize the signal. The 1–2 GHz frequency from oscillator 20 is divided by M in divider 22 and then compared in phase detector 13 with the frequency of reference oscillator 10. Note that the type of divider used here is based on digital rather than analog techniques, and is only operable to approximately 2 GHz. The output of the phase detector 13 is fed back over line 24 to adjust (stabilize) the frequency of the rf oscillator 20. This is then multiplied (XP) in multiplier 21 to achieve the desired rf frequency.

A problem associated with the arrangements shown in FIGS. 1 and 2 is that the modulation frequency fm that may be applied to the rf oscillator must be greater than about 1.5 times the 3 dB loop bandwidth. Otherwise the phase-lock loop will treat the modulation as an error signal and cancel it out. As well, the maximum deviation $\Delta f$ must not exceed fm, otherwise the loop can lock to a modulation sideband. Therefore the modulation index ($\Delta f/fm$) must be less than unity.

The present invention avoids the foregoing problem by using a frequency divider to phase-lock a microwave signal to a stable reference oscillator without the need for frequency multipliers. The frequency deviations $\Delta f$ applied at the rf oscillator are divided by N along with the output of the rf oscillator. Thus for a modulation index of 1.0 at the phase comparator, the frequency deviation $\Delta f$ at the rf oscillator is $$\Delta f = N \times fm$$

This means that the effective modulation index has been increased by a factor N.

FIG. 3 will also produce this result, when $N = P \times M$, however this arrangement has the disadvantage of having the multiplier 21 outside the feed-back loop. Any spurious signals such as harmonics generated in the multiplier will not be attenuated by the phase-locked loop. This problem is eliminated in the present invention.

FIG. 4 shows a block diagram of the fundamental system according to the invention. Various filters and amplifiers which may in practice be used have been omitted for simplicity.

A portion of the output signal from the rf oscillator 14 is divided by N in divider 30 so that it may be compared to the frequency of the stable reference oscillator 10 by phase detector 13. The output of the phase detector 13 is used to adjust the frequency of the rf oscillator 14 to that of the reference.

The analog frequency divider for use above 2 GHz is preferably such as disclosed in Canadian application Ser. No. 334,577, filed Aug. 28, 1979 in the name of Her Majesty the Queen in Right of Canada as represented by the Minister of National Defence and entitled Wideband MESFET Microwave Frequency Divider and corresponding to U.S. application Ser. No. 158,594, filed June 10, 1980 in the name of William D. Cornish. Such frequency dividers have made it possible to provide microwave frequency division with adequate signal conversion characteristics such as, for example, turn-on time of frequency division, ability to divide frequency modulated (F.M.) signals and ability to convert frequency spectra with acceptable degradation.

The microwave frequency divider used in the present invention eliminates the need for separate amplifiers. The invention employs MESFET (metal semiconductor field effect transistor) devices to perform parametric frequency division and amplification simultaneously at microwave frequency. For explanations of the structure and theory of operation of frequency dividers using microwave varactors reference may be had to Canadian Pat. No. 1,041,614 issued Oct. 31, 1978 in the name of Her Majesty in Right of Canada as represented by the Minister of National Defence, and corresponding to U.S. Pat. No. 4,152,680. The principle of operation of the divider used in the present invention is similar but replaces the varactors with the frequency dependent non-linear variable capacitance existing between the gate and source of a MESFET. The MESFET provides the additional advantage of not only enabling resonance of the input circuit to occur at $f_o/N$ but simultaneously provides an amplification function.

The principle of operation of the device according to the invention is based on the simplified equivalent circuit of FIGS. 5 and 6. In order that subharmonics can be generated, a frequency dependent non-linear capacitance must be present. This is found in $C_{gs}$, the gate-to-source non-linear capacitance caused by the Schottky barrier between the gate and the source of the MESFET. The $C_{gs}$ non-linearity has the characteristics of a Schottky—barrier varactor diode. These diodes have been used as multipliers, and diodes with similar characteristics, abrupt junction varactor diodes, have been used as dividers. When a signal is applied between the gate and the source, the MESFET may be envisioned as operating in two sections. The Schottky barrier diode containing $C_{gs}$ functions as a varactor divider producing subharmonics and the device transconductance, $g_m$, simultaneously provides amplification at the fundamental as well as the subharmonic frequencies.

The other elements shown in FIGS. 5 and 6 will be understood by those skilled in the art and it is not proposed to deal with these Figures in further detail.

FIG. 7 shows an equivalent circuit of a microwave frequency divider having a balanced configuration. Using a balanced configuration aids in filtering out the feed through of the fundamental as well as even harmonics. This is useful in octave band divide-by-2 devices because the input and output bands have a common frequency which makes normal filtering impossible. The operation of the divider shown in FIG. 7 will be described in terms of a divide-by-2 device; however the basic idea is applicable to higher order division, such as divide-by-4 and divide-by-8, as well. The dividers may be cascaded.

The input signal at a frequency $f_o$ is applied to input terminals 31 and, via first and second transmission lines 32 and 33, to the gates G of two MESFETs 34 and 35. Lines 32 and 33 are designed so that distance "1" from point "a" to "b" provides a resonant circuit at $f_o/2$, where $f_o$ is the input frequency. This causes the divided signals to be out of phase, as may be seen from FIGS. 8 and 9. FIG. 8 shows the input resonant circuit and FIG. 9 the wave structure at the output frequency $f_o/2$. That is, the divided signals are out of phase through each of the MESFETs while the input signal is in phase. Simultaneously with the non-linear capacitance frequency conversion at the Schottky—barriers between the gate and source of each MESFET, drain current amplification occurs via the MESFET transconductance producing a frequency divided signal with increased amplitude at the source terminals of the MESFETs. First and second output impedance matching lines 36 and 37 (at $f_o/2$) connect the drains of the MESFETs 34 and 35 to a balun (balanced-to-unbalanced) transformer generally indicated at 38. The balun 38 allows the output 39 to be connected to a coaxial line. At the input 31, a simple "T" connection (at "a") is suitable, for although the input of $f_o$ is unbalanced, the resonant lines 32 and 33 provide a balanced circuit at $f_o/2$. DC biasing of the MESFETs 34 and 35 is accomplished through lines which are decoupled at microwave frequencies. The S or lumped-parameters of the MESFETS can be used to compute bias conditions that will prevent oscillation.

In FIG. 7, $Z_1$ represents the impedances of the input transmission lines, $Z_2$ represents the drain matching impedances, $V_D$ is the DC drain voltage and $V_G$ is the DC gate voltage.

FIG. 10 shows a microstrip version of a balanced MESFET divider. The input at frequency $f_o$ passes through a DC blocking capacitor 60 which in this case also acts as a band pass filter at frequency $f_o$. A simple chip capacitor could also be used. Line 61 provides impedance matching at $f_o$. Lines 32 and 33 are designed to be resonant at $f_o/N$, where $f_o/N$ is the subharmonic of interest. Two MESFETs 34 and 35 are connected to lines 32 and 33 via their gates 66 and 67. The source terminals, not shown, are grounded. The drain terminals 68 and 69 are connected to lines 40 and 41 which provide impedance matching at $f_o/N$. Lines 40 and 41 are connected to the balun 42 through DC blocking capacitors 43. These blocking capacitors 43 could take the same form as capacitor 60. The drain voltage is applied to each MESFET through pads 44 which are connected to lines 40 and 41 through high impedance $\frac{1}{4}\lambda$ lines 45. The pie-shaped structures 46 are broadband short circuits tuned for the output frequency band. The gate voltage is applied through pad 47, $\frac{1}{4}\lambda$ lines 48 and the broadband short circuit 49 tuned to the input frequency band.

For dividers of higher order than 2, such as divide-by-4 and divide-by-8, a balanced circuit is not required for filtering since there is no overlap between the input and output bands. It may however improve the bandwidth and still be desirable. In this case, a circuit with one MESFET could be used as shown in the equivalent circuit of FIG. 11. FIG. 11 is believed to be self-explanatory in view of the foregoing description and it is not proposed to discuss it further.

Referring to FIG. 10 again there is no ground plane in the area 50 indicated by dashed lines, whereas there is a ground plane beneath the remaining circuitry because, as mentioned above, this is a microstrip configuration.

In addition to constructing the MESFET divider in microstrip, other configurations such as stripline, wave guide, co-planar wave guide, slotline and coaxial wave guide could be used.

The microwave frequency divider according to the present invention uses a MESFET device to simultaneously frequency divide and amplify microwave signals for use where both broad bandwidths and fast pulse response are required. Previously varactor diodes have been used to do this but they have typically 10 dB loss associated with the frequency conversion.

The embodiments of the invention in which an exclusive property or privilege is claimed are defined as follows:

1. A microwave frequency generator comprising a microwave frequency rf oscillator having a control input and having an output forming the output of the microwave frequency generator, a microwave frequency divider having an input connected to receive the output of the rf oscillator and frequency divide it by a factor N and having an output connected to one input of a phase detector, said phase detector having another input connected to receive the output of a reference oscillator and having an output connected to said control input, whereby the rf oscillator produces an rf frequency of N times the frequency of the reference oscillator, said microwave frequency divider comprising at least one MESFET (metal semiconductor field effect transistor) having a gate, a source and a drain, a first transmission line connected to said gate and source and to input terminal means, said transmission line forming, with inherent frequency dependent non-linear capacitance between said gate and source, a resonant circuit at $f_o/N$, where $f_o$ is the frequency to be applied to said input terminal means, a second transmission line being connected to said source and drain and to output terminal means, whereby said MESFET simultaneously provides parametric frequency division and amplification at microwave frequencies.

2. A microwave frequency generator as claimed in claim 1 wherein N is 2.

3. A microwave frequency generator comprising a microwave frequency rf oscillator having a control input and having an output forming the output of the microwave frequency generator, a microwave frequency divider having an input connected to receive the output of the rf oscillator and frequency divide it by a factor N and having an output connected to one input of a phase detector, said phase detector having another input connected to receive the output of a reference oscillator and having an output connected to said control input, whereby the rf oscillator produces an rf frequency of N times the frequency of the reference oscillator, said microwave frequency divider comprising a first and a second MESFET (metal semi-conductor field effect transistor), each having a source electrode, a drain electrode and a gate electrode, the gate of said first MESFET being connected via a first transmission line to an input terminal and the gate of said second MESFET being connected via a second transmission line to said input terminal, said source electrodes being connected to ground, said drain electrodes being connected via third and fourth transmission lines to a balun transformer having output connection means, said first and second transmission lines being of equal length and forming, with inherent gate-to-source frequency dependent non-linear capacitances of the MESFET's, a circuit resonant at $f_o/N$ where $f_o$ is the frequency of the rf oscillator, said MESFET's simultaneously providing parametric frequency division and amplification at microwave frequencies.

4. A microwave frequency generator as claimed in claim 3 wherein N is 2.

5. A microwave frequency generator as claimed in claim 4 wherein said transmission lines are microstrip lines.

6. A microwave frequency generator as claimed in claim 5 wherein a DC blocking capacitor is connected between said input terminal and said first and second transmission lines.

7. A microwave frequency generator as claimed in claim 6 wherein said third and fourth transmission lines provide impedance matching at $f_o/2$.

8. A microwave frequency generator as claimed in claim 7 wherein said third and fourth transmission lines are connected to said balun transformer via DC blocking capacitors.

9. A microwave frequency generator as claimed in claim 8 wherein high impedance means are provided for applying bias voltage to said drains.

10. A microwave frequency generator as claimed in claim 9 wherein high impedance means are provided for applying bias voltage to said gates.

* * * * *